US009000919B2

(12) United States Patent
Hadar et al.

(10) Patent No.: US 9,000,919 B2
(45) Date of Patent: Apr. 7, 2015

(54) ANTI-THEFT SYSTEM AND METHOD USING A MULTIPLE RADIO FREQUENCY SIGNAL FOR SOLAR PANEL SYSTEMS

(71) Applicant: Tigo Energy, Inc., Los Gatos, CA (US)

(72) Inventors: Ron Hadar, Cupertino, CA (US); Daniel Eizips, Sunnyvale, CA (US); Gil Katzir, Cupertino, CA (US); Luiz Felipe Fuks, Sunnyvale, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 0 days.

(21) Appl. No.: 13/779,456

(22) Filed: Feb. 27, 2013

(65) Prior Publication Data

US 2013/0222144 A1    Aug. 29, 2013

Related U.S. Application Data

(60) Provisional application No. 61/603,915, filed on Feb. 27, 2012.

(51) Int. Cl.
*G08B 21/00* (2006.01)
*G08B 21/18* (2006.01)
*G08B 13/14* (2006.01)
*H01L 31/02* (2006.01)

(52) U.S. Cl.
CPC .......... *G08B 21/182* (2013.01); *G08B 13/1409* (2013.01); *H01L 31/02021* (2013.01)

(58) Field of Classification Search
CPC ........................... G08B 21/182; G08B 13/1409
USPC ............ 340/568.1, 568.2, 571, 635; 136/243, 136/244
See application file for complete search history.

(56) References Cited

U.S. PATENT DOCUMENTS

| | | | |
|---|---|---|---|
| 2010/0207764 A1 | 8/2010 | Muhlberger et al. |
| 2010/0207770 A1 | 8/2010 | Thiemann |
| 2010/0295680 A1 | 11/2010 | Dumps |
| 2011/0273302 A1 | 11/2011 | Fornage et al. |

FOREIGN PATENT DOCUMENTS

JP        2010245532       10/2010

OTHER PUBLICATIONS

International Patent Application PCT/US2013/027965, International Search Report and Written Opinion, Jun. 2, 2013.
International Application No. PCT/US13/27965, International Preliminary Examination Report, Sep. 2, 2014.

*Primary Examiner* — Jeffery Hofsass
(74) *Attorney, Agent, or Firm* — Greenberg Traurig LLP

(57) ABSTRACT

A solar panel system includes a plurality of the panels connected together in one or more panel strings. An embodiment includes a signal generator module connected to the photovoltaic panel strings injecting a multiple radio frequency signal onto each of the strings and a detector module analyzing a frequency response echo from the panel strings. The signal generator may include a string coupling module communicating with a controller. The detector module analyzes the echo to obtain an analog fingerprint for each panel string and determine whether the fingerprint for each panel string is within an acceptable range. The detector module initiates an alarm when one of the fingerprints is outside the acceptable range. During night time, when no current is being produced by the photovoltaic cells, a DC or AC source may be connected to the panel strings to inject a signal onto the strings for the same purpose.

18 Claims, 10 Drawing Sheets

ANTI-THEFT SYSTEM AND METHOD USING A MULTIPLE RADIO FREQUENCY SIGNAL FOR SOLAR PANEL SYSTEMS

RELATED APPLICATIONS

The present application claims the benefit of priority of U.S. Provisional Application Ser. No. 61/603,915, filed Feb. 27, 2012, and titled ENHANCED, MORE ROBUST ANTI-THEFT SYSTEM AND METHOD FOR LARGE SOLAR PANEL SYSTEMS, the disclosure of which is incorporated herein by reference in its entirety.

FIELD OF THE TECHNOLOGY

This disclosure relates to photovoltaic systems in general, and more particularly but not limited to, improving the security of photovoltaic systems.

BACKGROUND

Despite the use of anti-theft systems in solar installations, solar modules (also known as solar panels) are still very attractive to thieves because many installations, particularly the larger systems, are located in isolated or remote sites and utilize a large number of expensive modules. What is therefore needed is an enhanced system offering a greater degree of security and protection for solar panels from potential theft.

SUMMARY OF THE DESCRIPTION

The present disclosure provides an enhanced system offering a greater degree of protection for solar panels from theft. In particular, a multi-modal system is provided, one that offers multiple theft detection and alarm systems within one system, thus enabling improved theft detection. In cases, only one mode might be implemented; in other cases, however, two or more modes could be combined for better protection. However, in any case, compared to systems currently available, the cost per panel would be lower and the installation would be easier.

Systems and methods offering a greater degree of protection for solar panels from potential theft are disclosed herein. Some embodiments are summarized in this section. In some cases only one mode might be implemented. In other cases, however, two or more modes in accordance with the present disclosure could be combined for enhanced, robust protection.

An embodiment of a solar panel system in accordance with the present disclosure includes a plurality of photovoltaic cells connected together in panels. A plurality of the panels is preferably connected together in one or more panel strings. The panel strings are connected to an inverter and in turn connected to an AC distribution grid. The anti-theft system includes a signal generator module connected to the one or more photovoltaic panel strings operable to produce and inject a multiple radio frequency signal onto each of the strings and a detector module operable to receive and analyze a frequency response echo from each of the panel strings to confirm integrity of the solar panel system.

An exemplary signal generator comprises a string coupling module communicating with a system on a chip (SOC) controller. Preferably the string coupling module in the signal generator module injects an RF signal in a range of 1 khz to 100 khz. An exemplary detector module analyzes an echo of the injected RF signal to obtain an analog fingerprint for each panel string. This detector module determines whether the fingerprint for each panel string is within an acceptable range. The detector module initiates an alarm when one of the fingerprints is outside the acceptable range.

A method of enhancing the anti-theft capability of a solar panel system in accordance with the present disclosure comprises providing a plurality of photovoltaic cells connected together in panels, and thence in one or more panel strings, connected to an inverter and in turn connected to an AC distribution grid; providing a signature generator module connected to the one or more panel strings; injecting a multiple radio frequency signal onto each of the strings via the signal generator module; receiving a frequency response echo from each of the panel strings; and analyzing the frequency response echo from each of the panel strings to confirm integrity of the solar panel system.

The injecting preferably comprises generating and transmitting the radio frequency (RF) signal to a string coupling module which transfers the signal to the panel string. The RF signal is preferably in a range of 1 khz to 100 khz. The analyzing preferably includes obtaining an analog fingerprint for each panel string and determining whether the fingerprint for each panel string is within an acceptable range. If the fingerprint is outside the acceptable range, an alarm may be initiated.

An apparatus for confirming integrity of a solar panel system in accordance with the present disclosure may include a plurality of photovoltaic cells connected together in panels, wherein the panels are connected together in panel strings. The apparatus preferably includes a signal generator module connected to the one or more photovoltaic panel strings operable to produce and inject a multiple radio frequency signal onto each of the strings. A detector module is operable to receive and analyze a frequency response echo from each of the panel strings to confirm integrity of the solar panel system. The signal generator module comprises a string coupling module communicating with a system on a chip (SOC) controller. The signal generator module injects an RF signal in a range of 1 khz to 100 khz onto each of the panel strings. The detector module analyzes an echo of the injected RF signal to obtain an analog fingerprint for each panel string, determines whether the fingerprint obtained for each panel string is within an acceptable range, and causes an alarm to be initiated when one of the fingerprints is outside the acceptable range.

During night time operational mode, when no current is being produced by the photovoltaic cells, a DC or AC source may be connected to the panel strings to generate and inject a signal for the same purpose. This injected signal is then monitored to determine whether it is within an acceptable range and, if outside the acceptable range, the detector module may generate or trigger an alarm.

The disclosure includes methods and apparatuses which perform these methods, including data processing systems which perform these methods, and computer readable media containing instructions which when executed on data processing systems cause the systems to perform these methods.

Other features will be apparent from the accompanying drawings and from the detailed description that follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. As a result, this specification represents a disclosure of all possible combinations of features described herein, except that certain combinations are excluded by reasons of mutually exclusive relationships in features, where the mutual exclusiveness is either explicitly identified in this specification or is apparent from the description of the respective features.

Figure 1:
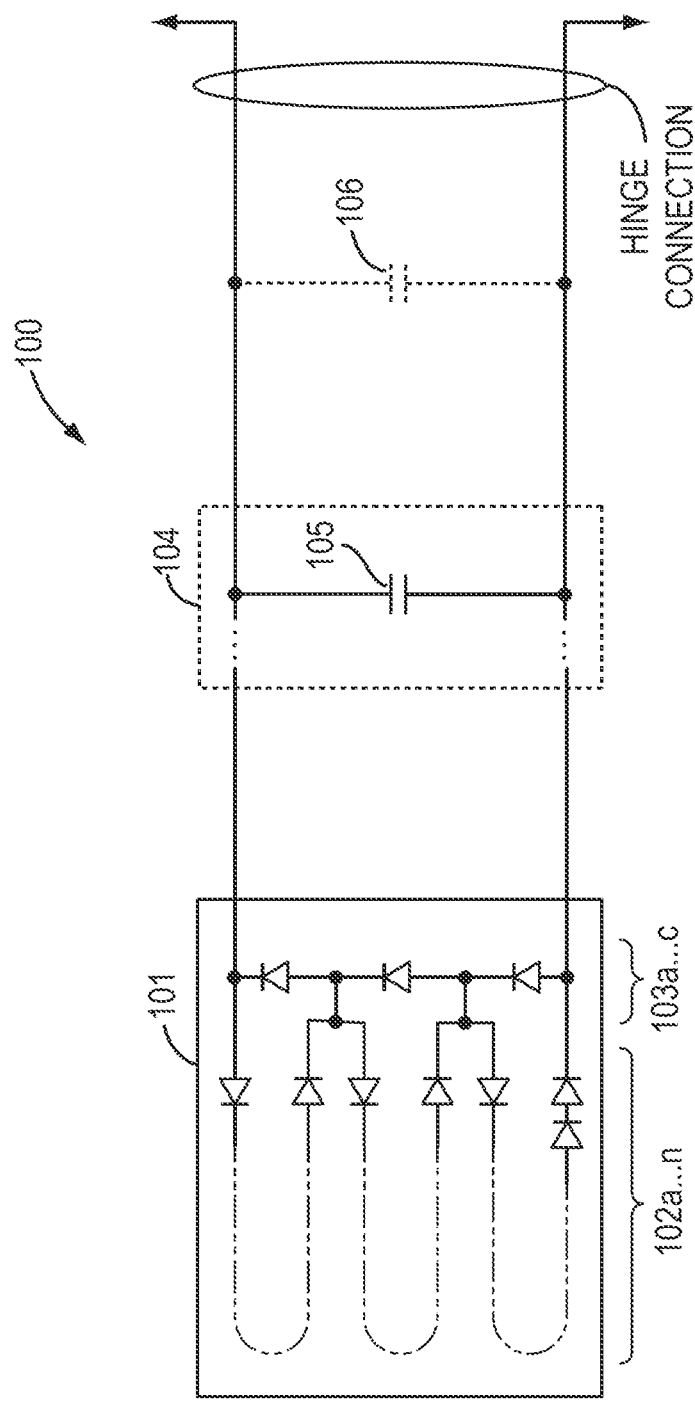
FIG. 1 is a simplified diagram of a typical solar panel system.

FIG. 1 shows a high-level overview of an exemplary solar panel system 100 in accordance with the present disclosure. Within solar panel 101 are solar cells, shown here as diodes 102a-n, and by-pass diodes 103a-c. It is obvious that different panels may have different partition schemes, and the number of by-pass diodes may change accordingly.

Figure 2:
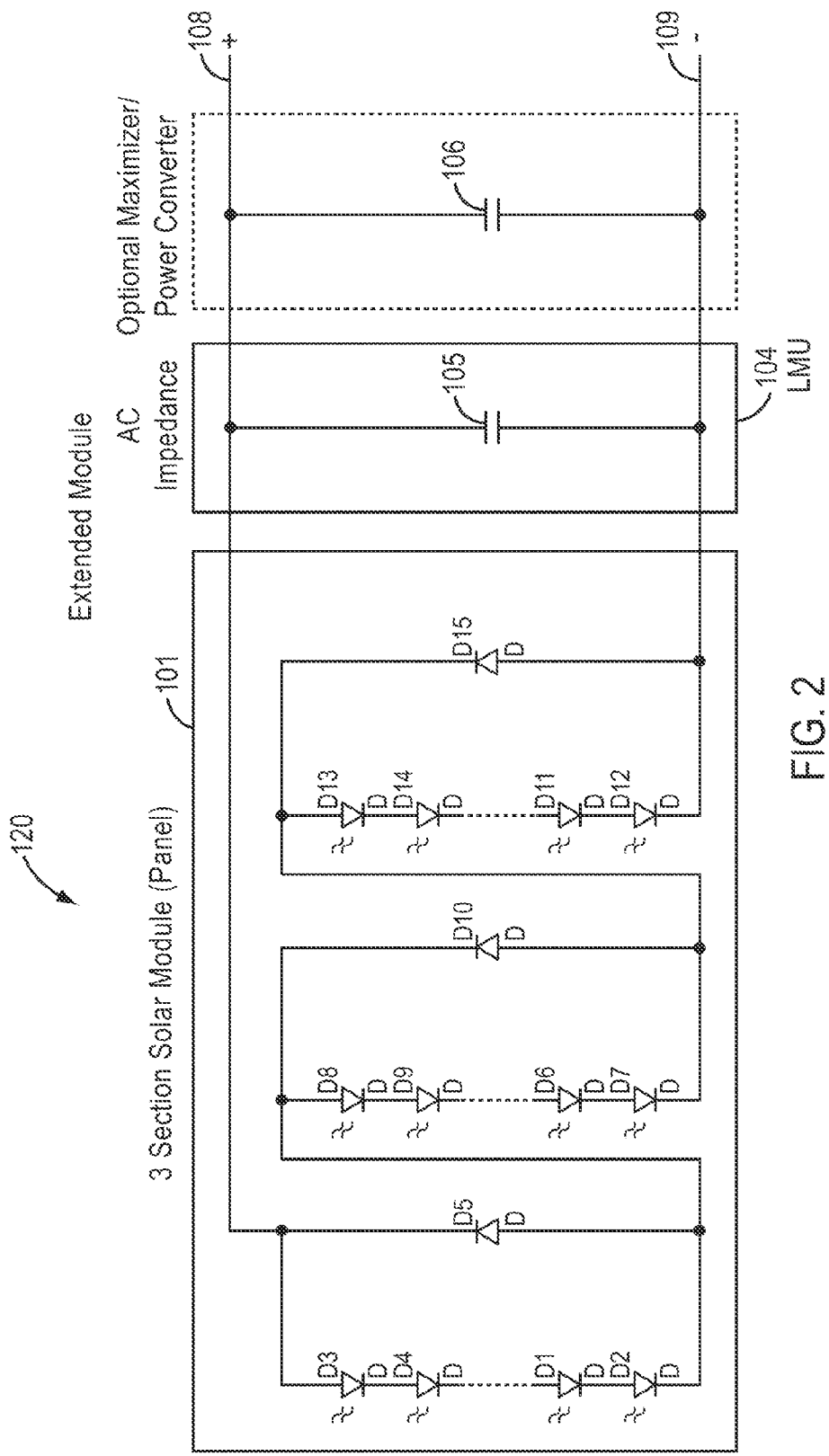
FIG. 2 is simplified diagram of another typical solar panel system.

FIG. 2 shows a high level overview of an alternative exemplary solar panel system 120, which, in this example, is a three-section panel, in accordance with the present disclosure that is configured as a 144-cell panel with 72-volt output voltage over output wires 108 and 109 from panel 101. Another common configuration is 60 to 80 cells yielding 30 to 54 volts, but still with three bypass diodes D5, D10, and D15 as shown in FIG. 2. In many cases an optional local optimization unit, referred to herein and throughout as local management unit (LMU) 104, may be integrated into the system.

Typically, LMU 104 would include an output capacitor 105 between the wires 108 and 109 connecting to the string (of panels). An LMU may or may not be present in the system in all cases. In those cases where no LMU is present, an additional capacitor, typically in the 1-10 µF range with sufficient voltage, may be added such as alternate capacitor 106 (shown in dashed lines in FIG. 2). Also, some LMU designs may not include an output capacitor 105. In those cases an alternate capacitor 106 would be required. Behind capacitor 106, the two wires 108 and 109 continue to be connected in a string.

Figure 3:
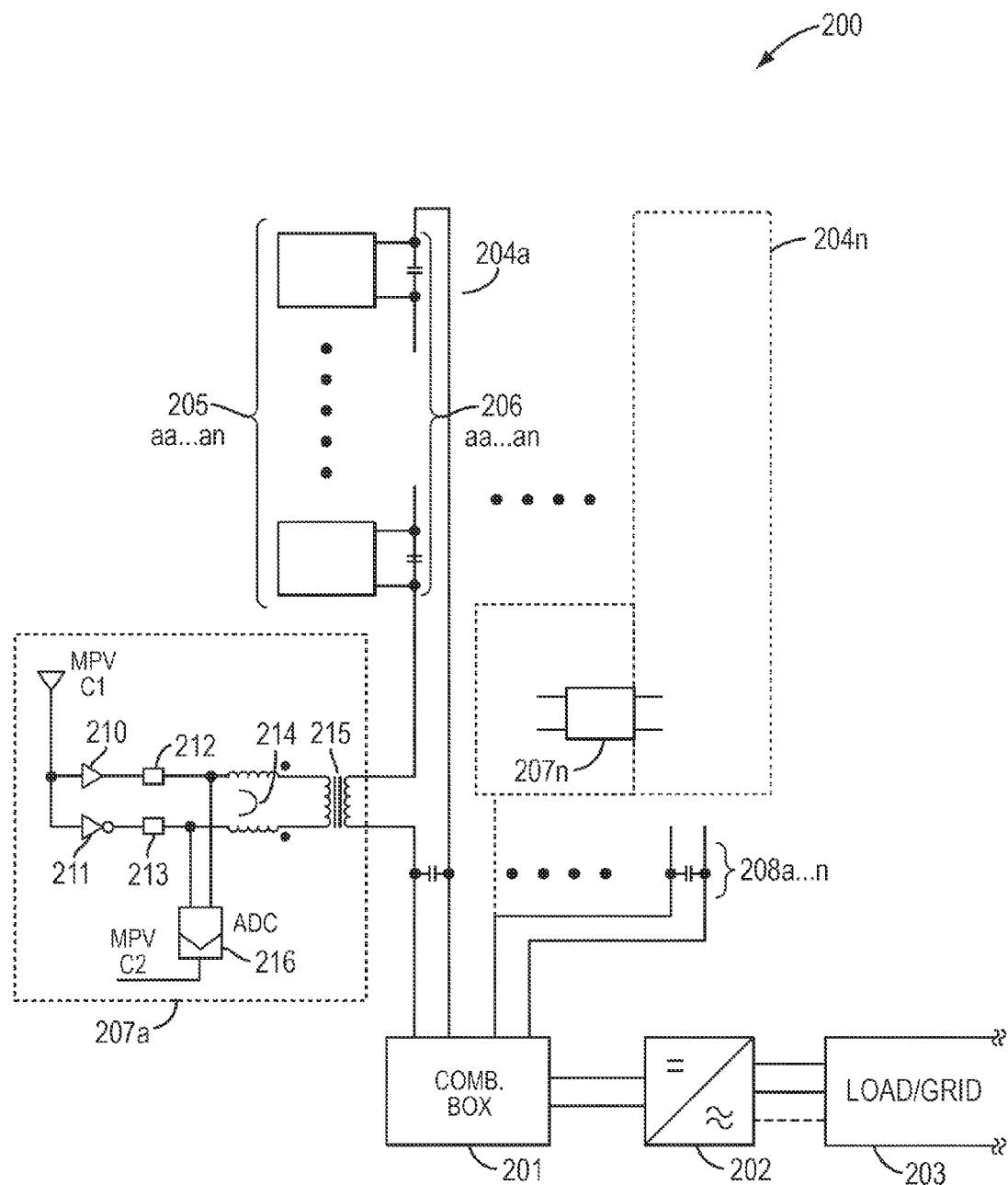
FIG. 3 is a diagram of an exemplary enhanced anti-theft mode for a solar panel system in accordance with the present disclosure.
Figure 4:
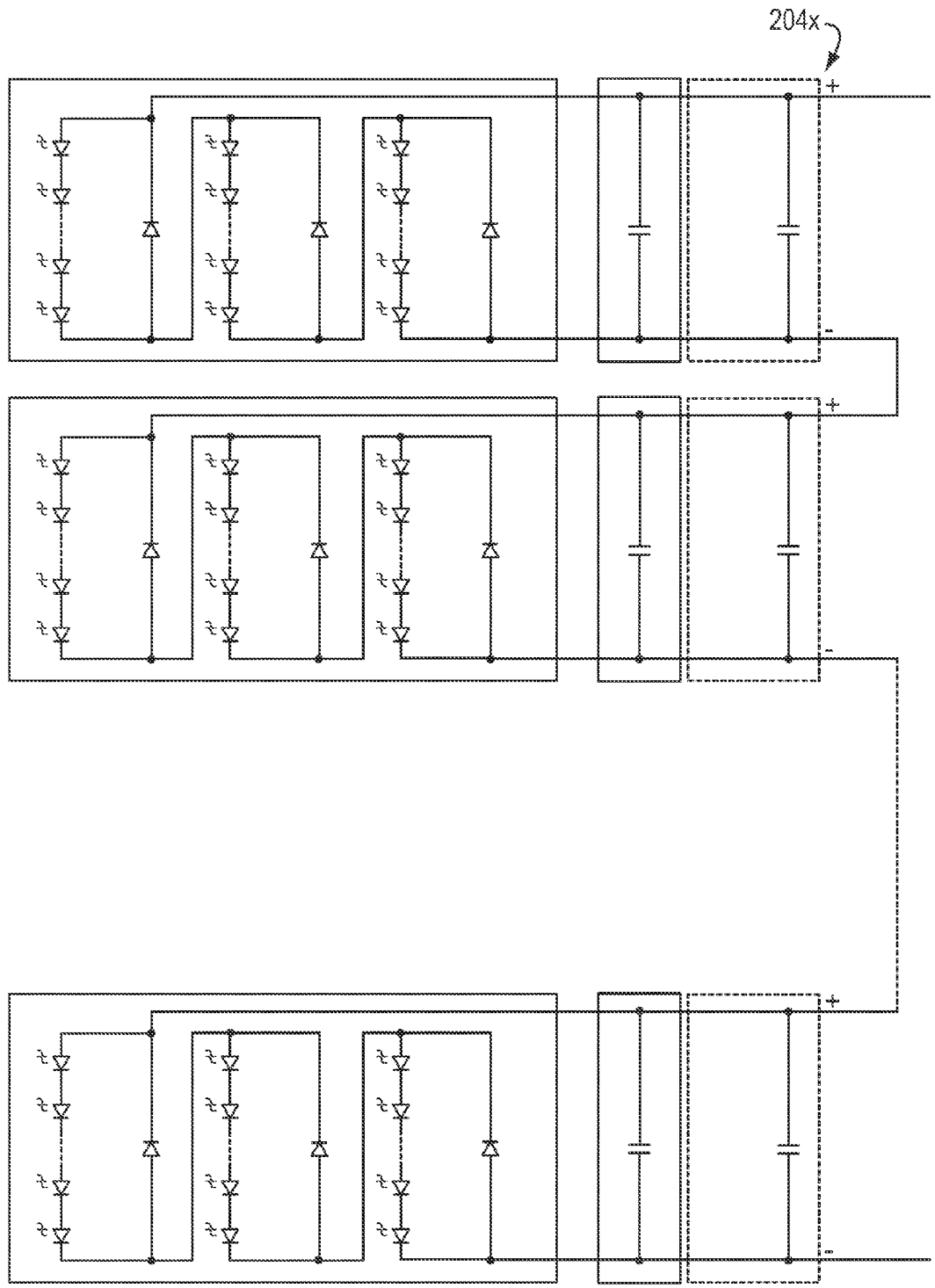
FIG. 4 illustrates an alternate string configuration of PV cell/panels in accordance with the present disclosure utilized in the enhanced anti-theft solar panel system shown in FIG. 3.

FIG. 3 illustrates a photovoltaic system 200 according to one embodiment utilizing enhanced theft management in accordance with the present disclosure. System 200 contains strings 204a-n. In each string 204a-n are multiple panels, of which exemplary panels 205aa-an are shown in detail, each with a capacitor 206aa-an at the string in the manner shown in FIGS. 1-2. It is clear that the other strings have similar features, but not all strings are shown, for reasons of clarity and simplicity. Alternative embodiments of strings 204x are shown in FIG. 4, and, in FIG. 5.

Turning back to FIG. 3, the system 200 includes a string coupling module 207a, exemplary of modules 207a-n for each of the strings 204a-n, others of which are not shown in detail, again, for reasons of clarity and simplicity. Module 207a contains two drivers 210 and 211, one of which is inverted and the other of which is not inverted; two impedance-matching resistors, 212 and 213; a common-mode suppression inductor 214; and a coupling transformer 215, which does a down transformation into the low impedance of the line. Typically, the transformation ratio is in the 10:1 range down, to better enable injection of the AC signal used to measure frequency response, etc. In some cases the down transformation may be a little as 1:1, while in other cases it may be 100:1 or even 1000:1.

In system 200, analog-to-digital converter (ADC) 216 connects to the microprocessor unit (MPU) discussed further below with reference to FIG. 7, typically a system-on-a-chip type, via MPU connector C2. In some other cases, to reduce costs, instead of placing an ADC 216 in each local unit 207, there is an analog converter with analog multiplexer at the MPU/SOC, and only two wires, or even a single wire, can be brought into the system main controller, which is described below.

This approach is possible due in part to the common-mode suppression inductor 214. String decoupling capacitors 208, typically in the 1-10 µF range with sufficient voltage, close each string into a separate loop, so the system 200 can measure the impedance and other behavior of each loop separately, at multiple frequencies. In some cases, inverter 202 may have an input capacitor, or combiner box 201 may contain circuitry with capacitors, but because these capacitors are not always present in these components, it is advisable, but not always required, to have, at or in module 207a, a string decoupling capacitor 208a.

Figure 6:
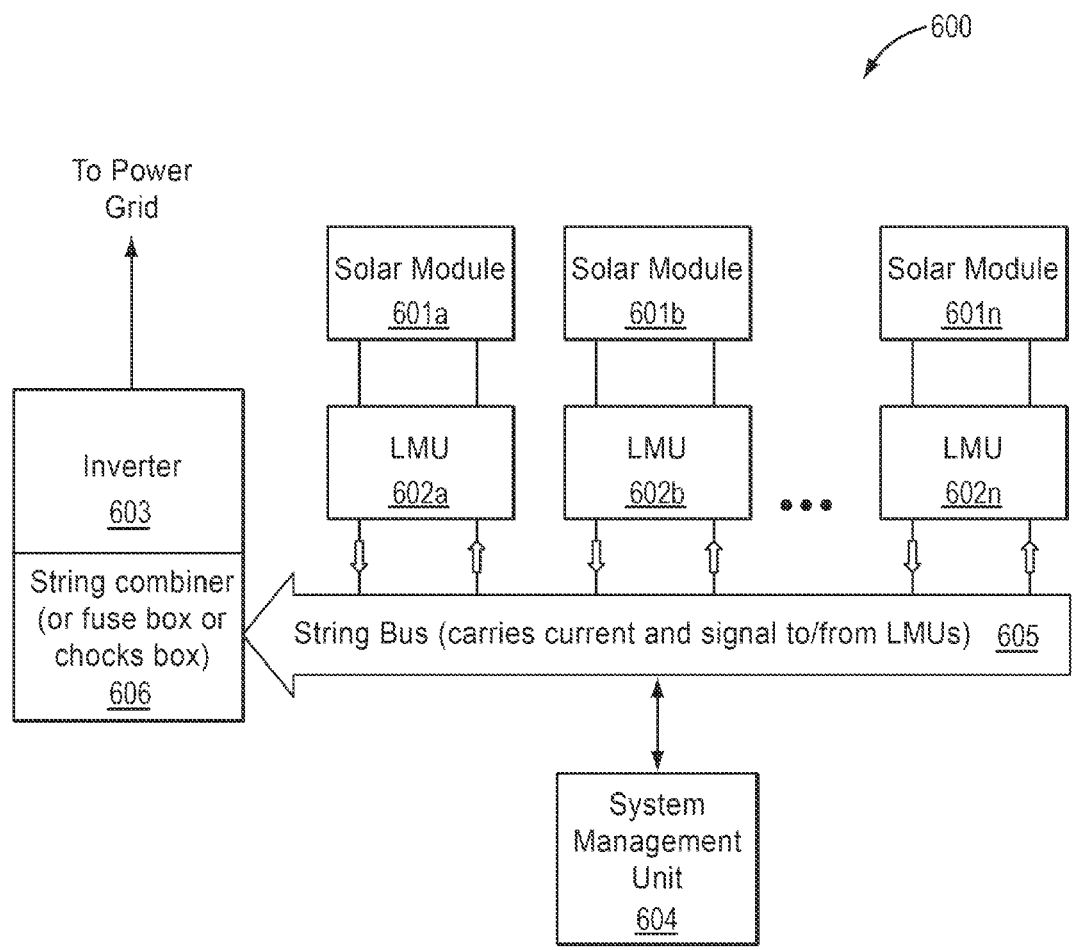
FIG. 6 is a simplified block diagram of a solar power system in accordance with the present disclosure.

FIG. 6 illustrates an overview of an exemplary photovoltaic system 600 with anti-theft system management in accordance with the present disclosure. The photovoltaic system 600 includes photovoltaic modules 601a, 601b, . . . , 601n, local management unit units 602a, 602b, . . . , 602n, an inverter 603, and a system management unit 604. In one embodiment, the system management unit 604 may be part of the inverter 603. In other embodiments, the system management unit 604 may be integrated into the combiner box 606, one of the local management units, or it may be a stand-alone unit.

The solar modules 601a, 601b, . . . 601n are connected in parallel to the local management unit units 602a, 602b, . . . , 602n respectively, which are connected in series to form a string bus 605, which eventually is connected to an inverter 603 and the system management unit 604. The string bus 605 can be can be one of many connected to the inverter 603 directly or as part of a mesh network or combiner boxes or fuse boxes (not shown). An isolated local management unit can be used as a combiner box 606 to adjust all voltages before connecting to the inverter 606; or, a single or multistring inverter can be used. To limit the changes in the voltage of the bus, the system management unit 704 may assign a different phase for each of the local management units (602a, 602b, . . . , 602n). Furthermore, the system management unit 604, can communicate with LMUs and other components in the system wirelessly so as to monitor and direct phase and duty cycle operational instructions to the appropriate local management units and other system components. The string bus 605, string combiner 606, and inverter 603, correspond to strings 204a-n, combiner 201 and inverter 202 respectively shown in FIG. 3.

Figure 7:
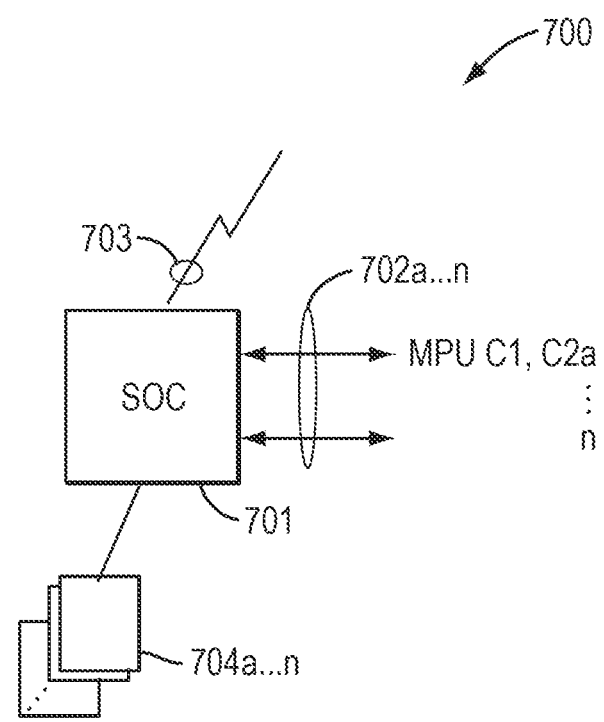
FIG. 7 is a simplified diagram of a control system for the solar power system shown in FIG. 3.

FIG. 7 shows an exemplary control system 700, according to one aspect of the system and method disclosed herein. Typically, controller 701 would be a system-on-a-chip (SOC) type, such as, for example, STM 32F4 microcontroller by ST Micro-Electronics, which is very suitable for this type of system. Connections 702a-n connect to the MPU C1 and C2 contacts, shown in FIG. 3, of all the strings in the solar panel system. Typically, one SOC controller 701 can easily handle up to 12 strings, and because a typical combiner box, such as box 701, typically has up to 12 strings, this approach creates a good match. SOC controller 701 would contain all the features needed for the control system, such as, for example, output pins that can drive the inverting and non-inverting drivers 210 and 211, as well as the ADC 216, in some cases with analog multiplexer to take in the measurements shown in FIG. 3. An SOC controller 701 also contains some program storage and some RAM, as well as software instances 704a-n, which include software for chip operations; for communicating, via any of the various wired or wireless communication methods over line 703 with the system management unit (SMU) 604 described below for generating a sweep across a wide range of frequencies, typically around 1-100 kHz; and the algorithms required to analyze the echo, including but not limited to impedance over frequency (looking for distinct peaks), FFTs, etc.

Figure 8:
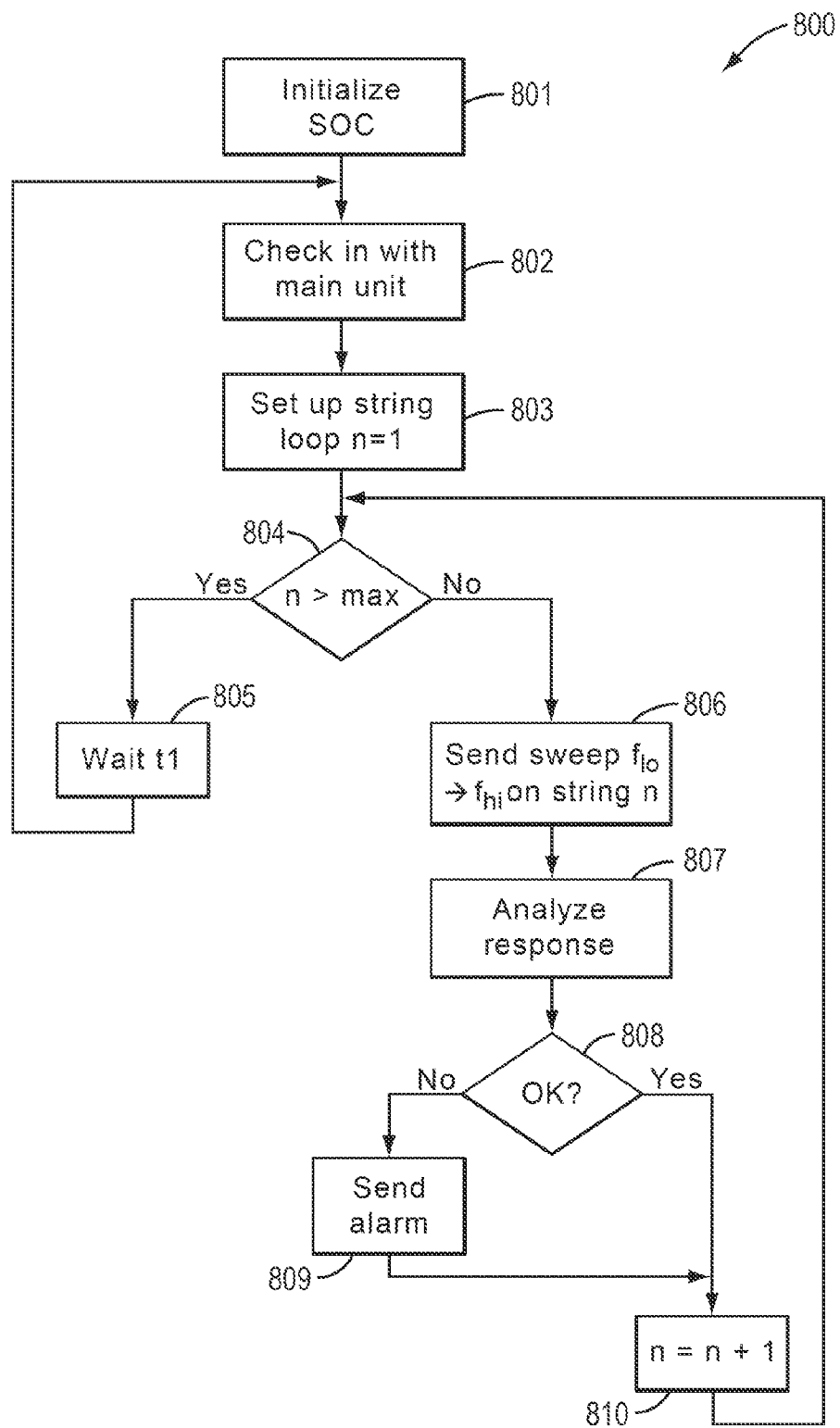
FIG. 8 is an operational flow diagram for the control system shown in FIG. 7.

FIG. 8 shows an exemplary process 800 for implementation of the enhanced anti-theft system according to one example of the system and method disclosed herein. This process is typically executed on the above-mentioned MPU in the SOC controller 301, but other suitable configurations can be used instead, without departing from the spirit of the system described herein. In step 801 the system on a chip (SOC) controller 801 is initialized. In step 802, the system checks in with the SMU 604 via communication line 703, to verify that the SMU 604 is present and able to communicate, and thus not stolen.

In step 803, the system sets up a number representing the number of loops, such as strings 204a-n, in the system, with n=1 to start with. In step 804, the system determines whether n is greater than the maximum number programmed for the loops. If yes, the process moves to step 805, where it waits for interval $t_1$ and then loops back to step 802 to start over again. In step 804, if n is not greater than the preprogrammed maximum number of process loops, in step 806, the system sends a sweep of radio frequency signals from $f_{lo} \rightarrow f_{hi}$ on string n, and in step 807, the system analyzes the frequency response. In practice, these two steps happen concurrently, or closely interleaved, where a few (as little as 1) pulses of a specific frequency are sent, and the resulting response is analyzed. Said response is an "analog fingerprint" of the specific loop (i.e., string 204x). It may vary somewhat with daylight (energy produced by solar calls changes their impedance) as well as somewhat with weather (e.g., rain can change stray capacities, thus modify the fingerprint somewhat), but it will change dramatically if a panel or wiring are removed. In step 808, the system checks to determine whether this fingerprint is within an acceptable range. If no, in step 809 the system sends an alarm to the main unit, and then the process continues to step 810, where n is incremented to n+1, and then the process loops back to step 804. If, in step 808, the system finds that the frequency is within an acceptable range, the process continues directly to step 810, without sending an alarm, and thence back to step 804. In some cases, the system may be programmed to send an OK status (not shown) when moving directly from step 808 to 810.

Figure 9:
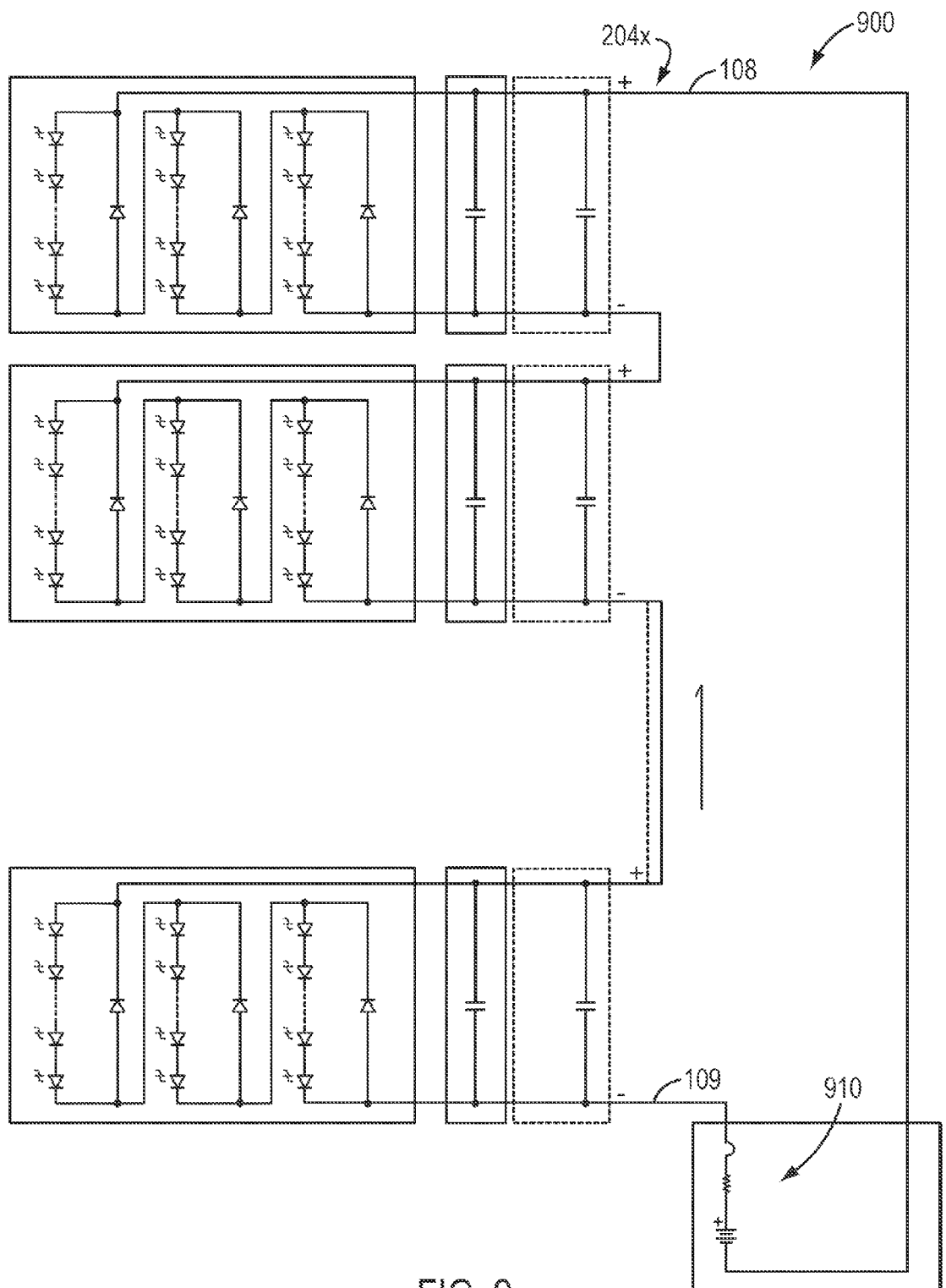
FIG. 9 is an alternative nighttime anti-theft mode for a solar panel system in accordance with the present disclosure.
Figure 10:
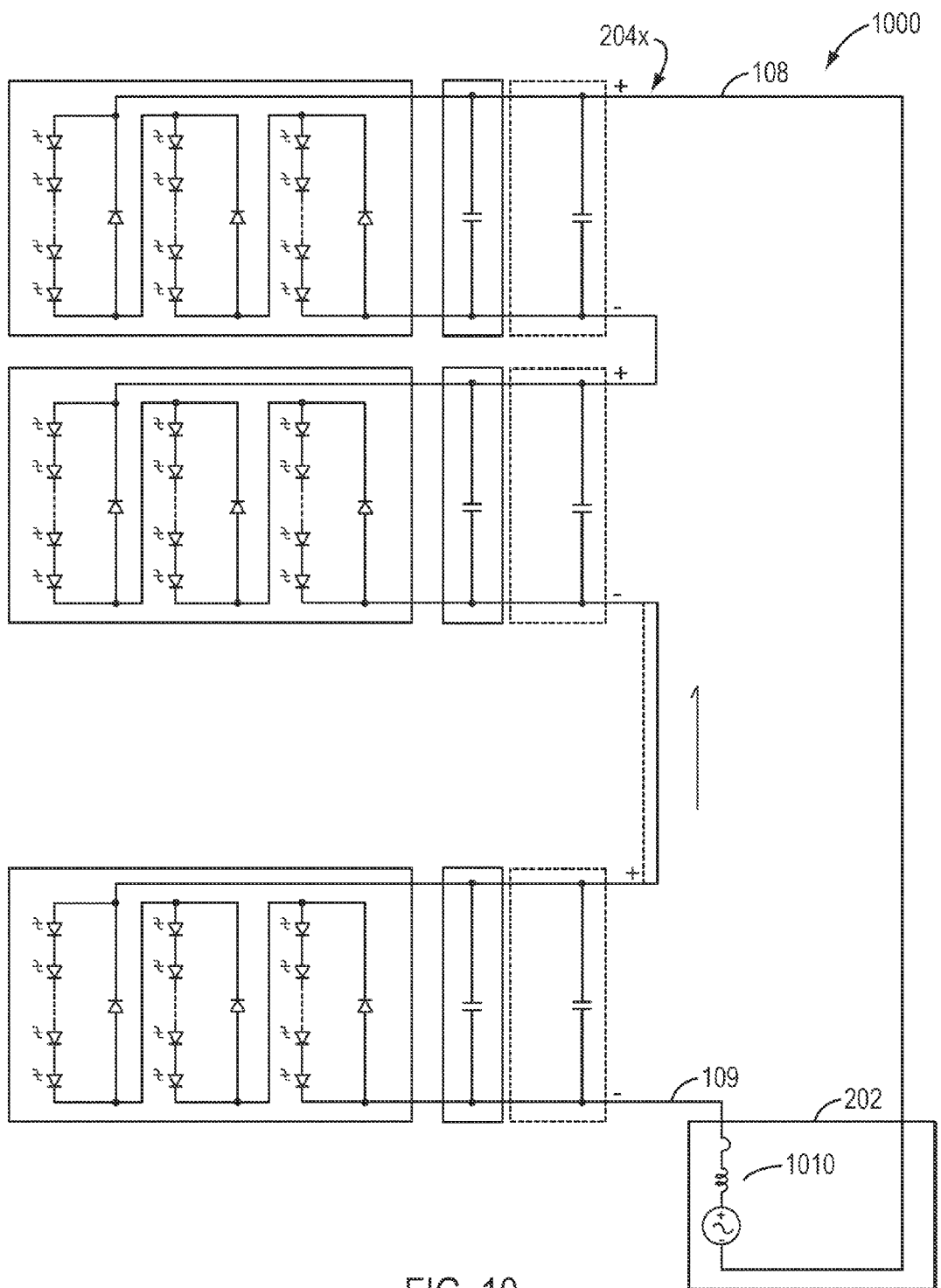
FIG. 10 is another alternative nighttime anti-theft mode for a solar panel configuration in accordance with the present disclosure.

During the daytime when the solar panels 101, 120, 204a-n, 204a-x are producing power as above described, the system 300 effectively operates to monitor against theft. However, at night, when there is no current being produced by the photovoltaic panels, another mechanism, or mode, is preferably implemented to provide an effective anti theft system. During the night time hours, a separate DC current power supply 500, 900 or 1000 as shown in FIGS. 5, 9, and 10 may be connected to the strings of panels 204x.

Figure 5:
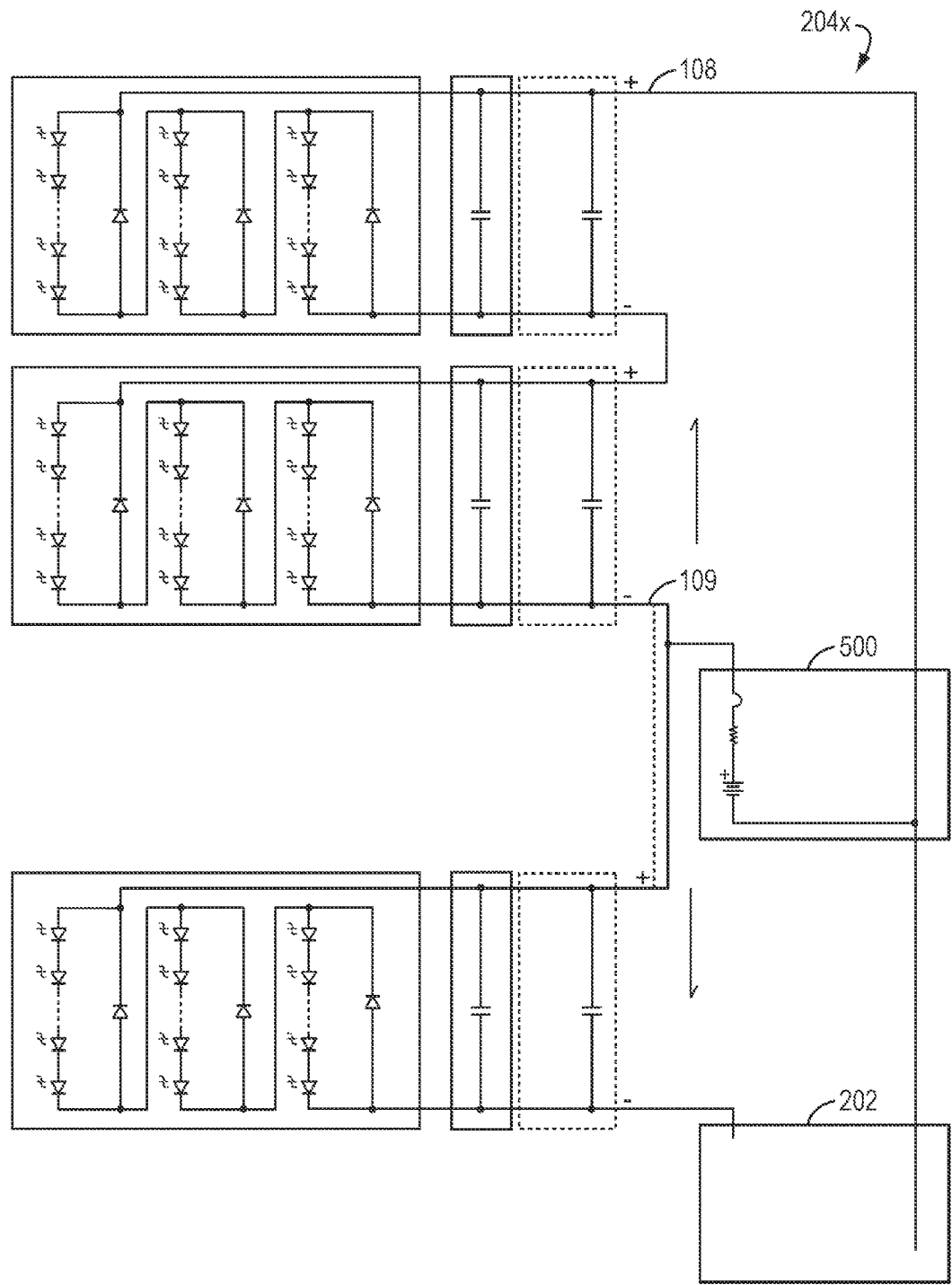
FIG. 5 illustrates another alternate string configuration of PV cell/panels in accordance with the present disclosure.

The configuration shown in FIG. 5 illustrates a DC power source 500 connected between one or more of the panels 100 or 120 and across wires 108 and 109 described above. This DC source is preferably disconnected from the panels during daytime operation. The configuration shown in FIG. 9 shows a DC power source 910 connected again across positive and negative lead wires 108 and 109, but this time, in the inverter 202. The configuration shown in FIG. 10 shows a low frequency AC power source 1010 in the inverter 202 connected again across the equivalent of wires 108 and 109. In these configurations, for example, as shown in FIGS. 5, and 9, a DC current may be connected and sent at night, and the sum of the reverse diodes and/or the solar cells' inherent diodes (opposite direction) voltage may be measured. Depending on the lengths of the strings, such a process may require voltages such as, for example, between 25 and 1000V. If both should be measured, a low frequency signal may be injected and the current's non-linear behavior may be used to determine numbers for diodes each way, enabling the system 300, in effect, to count panels, even if they don't each have an LMU 602. These two approaches may require each string to be temporarily to be disconnected from the string combiner 206 shown in FIG. 3. In another approach, as shown in FIG. 10, AC current may be injected, enabling both forward and reverse diode measurement in one operation.

In some cases, the system could tap a string containing maximizers so that it could apply a voltage somewhere along the string to forward bias k units and inverse bias the remaining n-k units (so that (n-k)Vt=k*Vmin_max_on. Such as approach yields a DC system that uses relatively little power but wakes up k maximizers, which in turn could directly communicate additional status information.

Further, the system and method disclosed herein can be also used to monitor a string of solar modules 204x during the day in order to detect abnormalities such as in the occurrence of arcing. If the transformer 215 is modified to present soft saturation, it may also be possible to measure the current. Simple additions to the circuitry could allow for monitoring DC currents with a shunt/hall effect or magneto-resistive sensor plus monitor the voltage and other environmental variables such as temperature, etc.

In addition, other modes of theft deterrence may be employed, such as, but not limited to, using cameras, IR/Thermal sensing or imaging, motion sensors, or simple mechanical methods such as complicated "anchoring" or attaching a tensioned string or simple extra wire whose continuity can be monitored in a straightforward way (as, for example, the ground wire that already is required by code). Another approach is the use of unique codes to enable only authorized users to turn the panels on. All these approaches should have some means of communication with a monitoring site. By combining one or more of these strategies, a far more secure approach can be taken, at low to moderate cost.

It is clear that many modifications and variations of the system and method disclosed herein may be made by one skilled in the art without departing from the spirit of the novel art of this disclosure. These modifications and variations do not depart from its broader spirit and scope, and the examples cited here are to be regarded in an illustrative rather than a restrictive sense.

In the foregoing specification, the disclosure has been described with reference to specific exemplary embodiments thereof. It will be evident that various modifications can be made thereto without departing from the broader spirit and scope as set forth in the following claims. The specification and drawings are, accordingly, to be regarded in an illustrative sense rather than a restrictive sense.

What is claimed is:

1. A solar panel system, comprising:
    a plurality of photovoltaic panels containing photovoltaic cells, the photovoltaic panels connected in one or more panel strings for direct current;
    a plurality of string decoupling capacitors coupled to the one or more panel strings to form a plurality of loops for radio frequency signals;
    at least one signal generator module connected to the one or more photovoltaic panel strings, the at least one signal generator module operable to produce and inject a multiple radio frequency signal onto the solar panel system; and
    at least one detector module operable to receive and analyze a frequency response echo from each of the loops to confirm integrity of the solar panel system.

2. The system of claim 1, wherein the signal generator comprises a string coupling module communicating with a microprocessor.

3. The system of claim 1, wherein the signal generator module injects an RF signal in a range of 1 khz to 100 khz.

4. The system of claim 3, wherein the detector module analyzes an echo of the injected RF signal to obtain an analog fingerprint.

5. The system of claim 4, wherein the detector module determines whether the fingerprint is within a predetermined range.

6. The system of claim 5, wherein the detector module initiates an alarm when the fingerprint is outside the predetermined range.

7. A method, comprising:
    providing a plurality of photovoltaic panels containing photovoltaic cells, the photovoltaic panels connected in one or more panel strings for direct current;
    providing a plurality of string decoupling capacitors coupled to the one or more panel strings to form a plurality of loops for radio frequency signals;
    providing at least one signal generator module connected to the one or more panel strings;
    injecting, by the at least one signal generator module, a multiple radio frequency signal onto the one or more panel strings;
    receiving a frequency response echo from each of the loops; and
    analyzing the frequency response echo to confirm integrity of the solar panel system.

8. The method of claim 7, wherein the injecting of the multiple frequency signal comprises generating and transmitting the radio frequency (RF) signal to a string coupling module which transfers the signal to the one or more panel strings.

9. The method of claim 7, wherein the injecting of the multiple frequency signal further comprises injecting an RF signal in a range of 1 khz to 100 khz.

10. The method of claim 8, wherein the analyzing of the frequency response echo comprises obtaining an analog fingerprint.

11. The method of claim 10, wherein the analyzing of the frequency response echo comprises determining whether the fingerprint is within a predetermined range.

12. The method of claim 11, further comprises initiating an alarm when the fingerprint is outside the predetermined range.

13. An apparatus for confirming integrity of a solar panel system comprising a plurality of photovoltaic panels containing photovoltaic cells, wherein the photovoltaic panels are connected in one or more panel strings for direct current, the apparatus comprising:
    at least one signal generator module connected to a plurality of loops for radio frequency signals, the loops formed via a plurality of string decoupling capacitors coupled with the one or more photovoltaic panel strings, the at least one signal generator module operable to produce and inject a multiple radio frequency signal onto each of the loops; and
    at least one detector module operable to receive and analyze a frequency response echo from each of the loops to confirm integrity of the solar panel system.

14. The apparatus of claim 13, wherein the signal generator module comprises a string coupling module communicating with a system on a chip (SOC) controller.

15. The apparatus of claim 14, wherein the signal generator module injects an RF signal in a range of 1 khz to 100 khz onto each of the loops.

16. The apparatus of claim 15, wherein the detector module analyzes an echo of the injected RF signal to obtain an analog fingerprint.

17. The apparatus of claim 16, wherein the detector module determines whether the fingerprint is within a predetermined range.

18. The apparatus of claim 13, wherein the detector module initiates an alarm when the fingerprint is outside the predetermined range.

* * * * *